United States Patent
Mingazhev

(10) Patent No.: US 6,322,671 B1
(45) Date of Patent: Nov. 27, 2001

(54) METHOD FOR FORMATION OF PROTECTIVE COATINGS WITH QUASI-PLASTICITY PROPERTIES

(75) Inventor: Askar Dzhamilevich Mingazhev, Ufa (RU)

(73) Assignee: Ionica, LLC, Los Angeles, CA (US)

( * ) Notice: Subject to any disclaimer, the term of this patent is extended or adjusted under 35 U.S.C. 154(b) by 0 days.

(21) Appl. No.: 09/477,607

(22) Filed: Jan. 4, 2000

(51) Int. Cl.$^7$ .............. C23C 16/44; C23C 14/22; C23C 14/34; C23C 14/04; C23C 16/04

(52) U.S. Cl. .................. 204/192.1; 427/248.1; 427/255.5; 427/255.11; 427/255.28; 427/240; 427/288; 427/294; 118/730; 204/192.16

(58) Field of Search ............... 427/248.1, 255.28, 427/255.11, 255.5, 288, 240, 294; 118/730; 204/192.1, 192.16

(56) References Cited

U.S. PATENT DOCUMENTS

| | | | |
|---|---|---|---|
| 4,798,165 | * 1/1989 | DeBoer et al. | 118/715 |
| 5,630,879 | * 5/1997 | Eichmann et al. | 118/720 |
| 5,993,904 | * 11/1999 | Boucher | 427/248.1 |

FOREIGN PATENT DOCUMENTS 3-2802 * 1/1991 (JP).
WO 90/02218 3/1990 (WO).

* cited by examiner

Primary Examiner—Shrive Beck
Assistant Examiner—Michael Barr

(57) ABSTRACT

A process is described for forming integral coatings on metal and/or non-metallic substrate surfaces by the method of physical and chemical deposition in a vacuum of metal and/or non-metallic materials. The process, improved so as to obtain a coating with quasi-plasticity behavior, includes an action for depositing material onto substrate surfaces in the shape of multiple separated-in-space deposition zones of predetermined form and dimensions, and, also, an action for continuous migration of these deposition zones over the substrate surface during the whole of the coating formation process, while preserving a uniform coating thickness. In a particular embodiment, a protective high-temperature resistant NiCrAlY system coating is formed on a protected component by physical vapor deposition, which deposition is done through a screen having a series of narrow and long slots. The screen functions as a means for creating multiple separated-in-space deposition zones, and encloses the protected component along its contours with a 3–5 mm clearance. The screen rotates together with the protected component relative to the deposited material flow, so as to permit the continuous migration of the deposition zones over the protected component surface.

18 Claims, 3 Drawing Sheets

METHOD FOR FORMATION OF PROTECTIVE COATINGS WITH QUASI-PLASTICITY PROPERTIES

BACKGROUND OF THE INVENTION

1. Field of the Invention

The present invention pertains to the field of coating processes by the method of physical and chemical vapor deposition (PVD and CVD), allowing the improvement of operational properties of the coatings, by delivering to the coatings quasi-plasticity behavior and can be used for the formation of protective metal and non-metallic coatings on substrates of the components, operating under environmental degradation mechanisms, e.g., for applying high-temperature coatings on gas-turbine blades.

2. Background

Usually, the following formation process is used to obtain coatings on substrates by the method of vaporization and deposition in a vacuum. A substrate is placed into a vacuum device chamber, having a source of material for vaporization (e.g., a titanium cathode, vaporized by the ionic-arc plasma method in a nitrogen media, resulting in titanium nitride being deposited onto the substrate surface); the necessary vacuum is produced, then the material is vaporized and deposited onto the substrate surface in the form of an integral flow (i.e., the coating is formed under the integral build-up front), the deposition is continued until a determined thickness of the coating is obtained.

The considered methods for coatings production are used in various fields of technology, where it is necessary to transfer to surfaces some special properties, providing higher resistance to wear, corrosion, erosion, high-temperatures, etc., than that of the material the surface is made. The creation of highly effective protective coatings, with minimal negative influence upon the degradation resistance of substrates, is vital in such fields as energy generating engines, aircraft engines, machine and ship building. Existing coating formation methods do not allow the production of coatings which meet the present requirements. In particular, the low quality of the present coatings is explained by unsatisfactory quasi-plasticity properties of the deposited materials. With this, the quasi-plasticity properties of the coatings depend upon the thickness of the coatings. For example, for various materials and particular deposition conditions, there exist particular threshold thickness values, which, when exceeded, significantly lower the quasi-plasticity properties. For example, in the case of titanium nitride obtained by the ionic-plasma method, this thickness value makes about 5 microns, which requires a special layer being applied to ensure a proper thickness. (E.g., International Patent WO N 90/02218: "PLASMA METHOD FOR COATING AN OBJECT WITH A HARD METAL".) With this, the quasi-plasticity properties of the materials, when the critical thickness of coatings is not exceeded, also remain unsatisfactory.

At the same time, the range of the necessary thickness values for protective coatings lies between several microns and several hundred microns, i.e., the requirements of the coating thickness exceed the ability to provide quasi-plasticity, which results in a lower quality of the coatings and poor characteristics of the protected substrates.

It is known that with all other conditions being equal, the properties of a coating are determined by the presence of defects, the type of the structure and the thickness. In the general case for the methods being considered, the defects are appearing and growing in number during the coating formation, due to the interaction of structural elements of the coating within the growth process. Along with this, while the coating thickness increases, the negative effect of defects increases. The other cause of the low quality of coatings is in the orientation of the coating structural elements not being optimal from the functional viewpoint.

As it follows from the above statement, in order to provide a higher quality of coatings, it is desirable to meet the following three objectives:

Decrease the formation of defects and the negative interaction of structural elements during the coating formation process;

Obtain a predetermined structure and orientation of the structural elements of the coating;

Decrease the sensitivity of the coating and the coated substrate to the thickness of the coating.

It is known that various methods of coatings production in a vacuum form different structural types: a columnar structure, an equal-axis structure, a cone-like structure, etc. However, the problems of defects formation, including the dependence of defects on the thickness of the coating, are common for all cases.

To illustrate the idea, the above-mentioned problems of quality improvement are considered using the example of the class of coatings, having a columnar structure, with such a coating being taken as a prototype coating, together with a prototype method for analysis.

The prototype: a protective coating formed by integral build-up front by the method of PVD, providing a columnar structure.

The drawbacks of the prototype: low quality, unsatisfactory quasi-plasticity properties, high density of defects, non-optimal structure and orientation of structural elements, and sensitivity of properties to the thickness of the coating.

The causes of the drawbacks:

Defects appearing due to interaction of the structural elements (grains and crystals) of the coating during the growth process;

A columnar structure, oriented perpendicular to the substrate surface, which, as a rule, is non-optimal.

The usual columnar structure for this class of protective coatings diminishes their operational properties. The columnar structural elements, located perpendicular to the substrate surface, make borders, which are also oriented in a perpendicular manner to the substrate surface. Thus, the mechanical strength of such coatings is determined, in the final analysis, by the strength of the bonds between the columnar elements. In the conditions of high temperatures and aggressive media, such borders are good conductors of alien aggressive chemical elements, leading to coatings destruction, which is aggravated also by mechanical stresses. Naturally, cracks are appearing in such coatings, acting as tension concentrators, leading to the fast destruction of a protected substrate.

SUMMARY OF THE INVENTION.

The present invention comprises versions of formation of integral protective coatings with improved quasi-plasticity behavior, which formation includes the following steps:

1. Preparing of substrate surface for a protective coating application;
2. Locating the substrate into a vacuum vapor deposition device chamber in front of the deposited material source;
3. Providing an action for deposition of the material onto the substrate surface in the form of multiple separated-in-space deposition zones;

4. Providing an action for constant migration of said multiple deposition zones over the substrate surface during the whole process of coating formation, while uniformly distributing the material over the substrate surface;

5. Creating a vacuum necessary for condensation of the deposition material over the substrate surface in a vacuum device chamber;

6. Vaporizing and deposition of the material over the substrate surface in the shape of constantly migrating separated-in-space zones, making an integral, uniform coating of a necessary thickness, and if necessary, providing a following (final) treatment of the coating, e.g., re-crystallization annealing in a vacuum.

It is an object of the present invention to:

To create conditions allowing an additional degree of growth freedom for the structural elements, so as to diminish the degree of interaction of the coating structural elements being formed, hence diminishing the formation of defects;

To form a predetermined coating structure and orientation of the structural elements, so as to provide the most efficient resistance to the deterioration factors.

Generally, the optimal orientation of columnar structural elements of a coating would be when such elements are parallel to the substrate surface; however, such coatings do not exist at present.

The particular ways in which these objectives are met, together with other objectives and improvements of the present invention are described in the detailed description of the invention hereafter.

BRIEF DESCRIPTION OF THE DRAWING

The invention may better be understood by reference to the following detailed description of a preferred embodiment thereof, which is given hereafter with the several figures of the drawing in which.

DETAILED DESCRIPTION OF A PREFERRED EMBODIMENT

Figure 1:
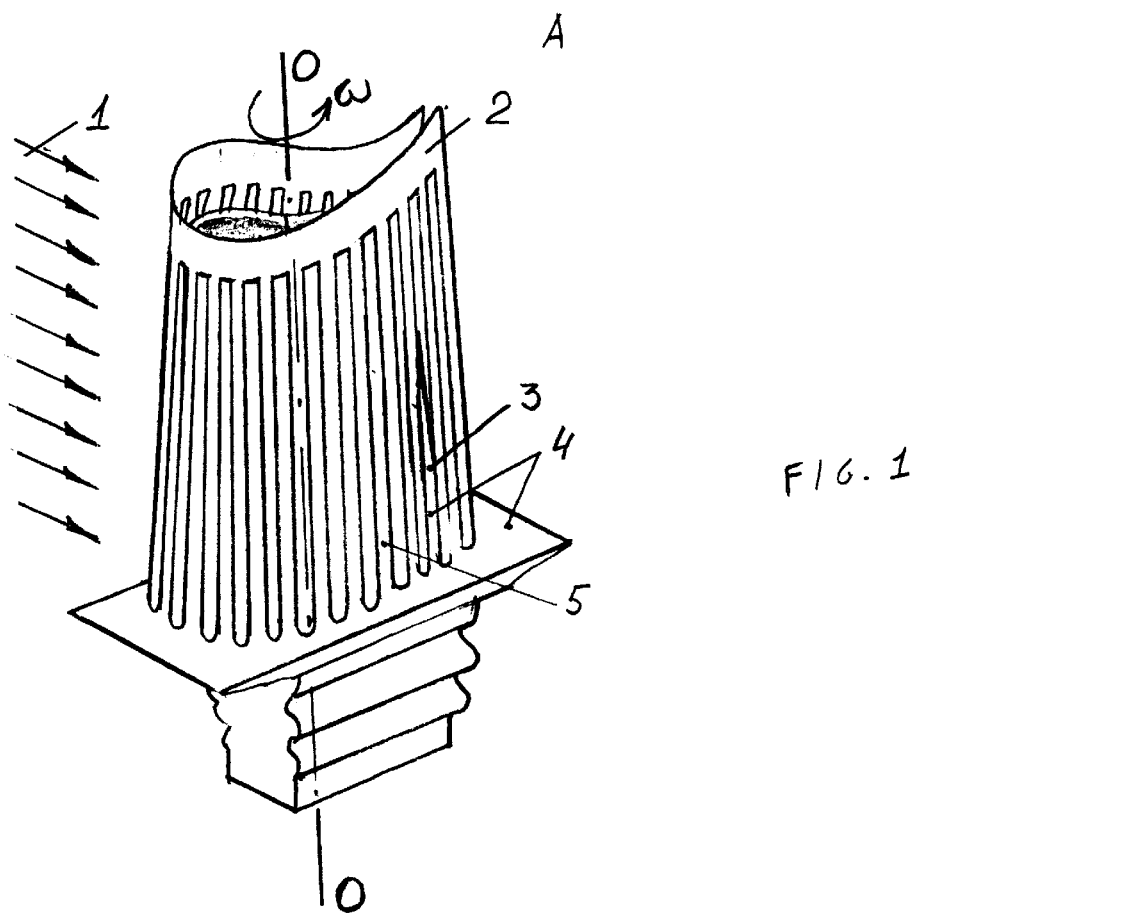
FIG. 1 is a perspective view of a substrate being coated in accordance with an embodiment of the present invention.

Referring first to FIG. 1, a substrate 4 to be coated, such as an airfoil of a gas turbine, is to be coated by directing a flow 1 of coating material from a deposited material source (not shown) toward the component 4 to coat the surface of the substrate 4, creating a coating 3.

First, the surface of the substrate 4 is prepared for material application according to the chosen method. The preparation of the substrate surface for protective coating application can be done by one of the known methods usually used for PVD and CVD practice and traditionally accepted for these particular kinds of coatings and materials. The surface preparation serves to provide appropriate purity of the surface (e.g. washing in solvents, sand blowing, etc.). An appropriate preparation method is chosen, depending on the particular substrate and coating materials, and vacuum coating application method. The methods of surface preparation are well known; thus, it is not necessary to consider them herein.

The substrate 4 is placed into a vacuum chamber. The substrate positioning in the vacuum device chamber is usually provided by well-known devices, e.g. an adjusting means for a gas-turbine blade. In this case, a coating is usually applied onto a group of substrates simultaneously. Each substrate 4 is mounted so as to be able to rotate about a rotational axis 0—0. In the illustrated embodiment, the rotational axis is substantially perpendicular to the direction of the flow 1 of coating material. The substrate can be rotated about the rotational axis 0—0 at an angular velocity $\omega$.

In accordance with an aspect of the present invention, the vaporized material is deposited onto the substrate surface in the form of multiple separated-in-space deposition zones. The action for the deposition of the vaporized material onto the substrate surface in the shape of separated-in-space zones could be performed in various ways, e.g., with the help of a means for dividing an integral flow 1 of the sprayed material into multiple separated-in-space flows. For this purpose, a screen 2 (a mask) can be used, having holes 5, modeling the distribution and cross-section dimensions of these flows (i.e. deposition zones). With this, the partitions 6 between the holes (i.e., screening zones of the screen) separate the deposition zones. Thus, the partition size (i.e., the distance between the holes 5) is selected, taking into consideration that the deposition zones should have separation between them, providing minimal screening of the substrate. The screen holes model the dimensions and the shapes of the deposition zones. The deposition zone shapes and dimensions can be varied in each particular case. The screen 2 is placed in front of the surface of the substrate 4 at the distance of 3–20 mm, and ideally 3–5 mm. The screen 2 has slots 5, and provides screening of the surface, leaving the unscreened stripes (deposition zones) of a length equal to the length of the slots, which length is determined by the coated area measurements. The width of the slots 5 may be varied from 0.1–5.0 mm, with the intervals between the slots varying from 0.1–5 mm. The screen slots 5 are oriented along the common rotation axis 0—0 of the screen and the substrate. The screen 2 encloses the substrate 4 along the closed contour and is stiffly attached to the substrate 4.

The deposition of the coating material is introduced through slots 5 of the screen 2 onto the substrate surface 4. An action is provided for constant migration of the multiple separated-in-space deposition zones over the substrate surface during the coating process. The action for the constant migration of the above-mentioned multiple separated-in space deposition zones over the substrate surface within the coating formation process could be performed in various ways. For example, when using the screen 2 with holes 5, it can be realized by making the substrate 4 move relative to the separated-in-space deposition flows and/or by making the screen 2 move relative to the integral flow 1 of the deposited material. With this, the screen 2 and the substrate 4 can be moved relative to each other as required. In other words, it is possible to use a joint rotation motion of the substrate 4 and the screen 2 relative to the integral deposited material flow 1, with a clearance between the screen 2 and the substrate surface, providing the migration of the deposition flows relative to the substrate surface. Using this approach, the present coating formation method is realized even under the condition of relative immobility of the substrate and the screen.

For this:

The whole of the operating area of the screen 2 has holes 5 in the shape of narrow and long slots oriented in one direction;

This screen encloses the substrate 4 along a closed contour, with a clearance between the screen and the substrate providing the deposition zones movement or migration while the screen and substrate deviation angle change relative to the direction of the material deposition integral flow;

The slots 5 are oriented along the substrate rotation axis 0—0;

The screen surface is oriented across the direction of the material deposition;

The deposition zone migration is realized by rotation of the substrate 4 and the screen 2 relative to the substrate rotation axis 0—0, while this rotation axis is oriented across the integral flow 1 of the deposition material.

With this, the screen 2 can rotate together with the substrate 4, and may be immovable relative to the substrate 4. Also, the screen 2 can rotate faster or slower than the substrate 4, the screen can rotate in the opposite direction, fulfill reciprocal rotation motions, or be immovable relative to the deposition material flow 1. In all of the mentioned cases, the principle of the present method will be realized.

The lengths of the slots 5 could be equal to or exceed the dimension of the coated substrate surface, the slots being oriented in one direction. For example, the slots can be aligned with the axis of rotation 0—0. As for the slot widths, they can range between 0.1–5.0 mm (which values can be determined by experimentation with various materials and deposition conditions), and depend on vacuum value, rate of individual deposition zone migration and kind of material deposited. In addition, the width of the partitions 6 that separate the deposited material flow 1 is also in the range of 0.1–5.0 mm.

In the case when the substrate 4 has a complicated configuration, it is expedient to make a screen 2 replicating the blade wing configuration. With this, it is better to orient the narrow and long slots 5 along the profile generating line of the protected component (gas-turbine blade). In this case, the substrate 4 and the screen 2 rotate together, with no shift relative to each other. In the process of the joint rotation of the substrate 4 and the screen 2, division of the integral flow of the deposited material 1 into multiple separated-in-space flows takes place. The flows, migrating over the substrate surface, form an integral coating, providing deposition of the material in the shape of separated-in-space zones, such zones also migrating over the surface.

Figure 2:
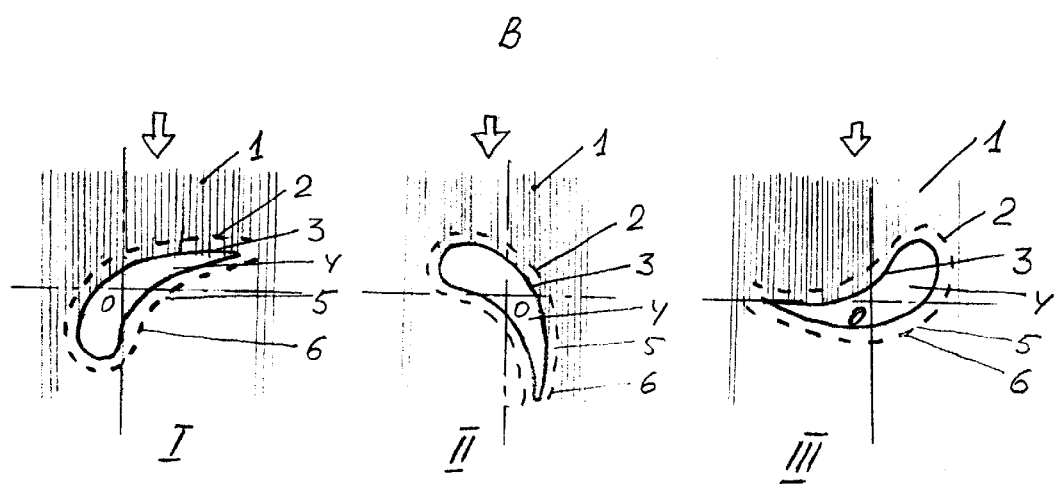
FIG. 2 shows a series of top views of the substrate being coated in accordance with the present invention.

Views I, II, and III of FIG. 2 show the changes in the direction of the flow 1 of the deposited material as the substrate 4 and the screen 2 rotate about the rotational axis 0—0 relative to the flow 1.

Figure 3:
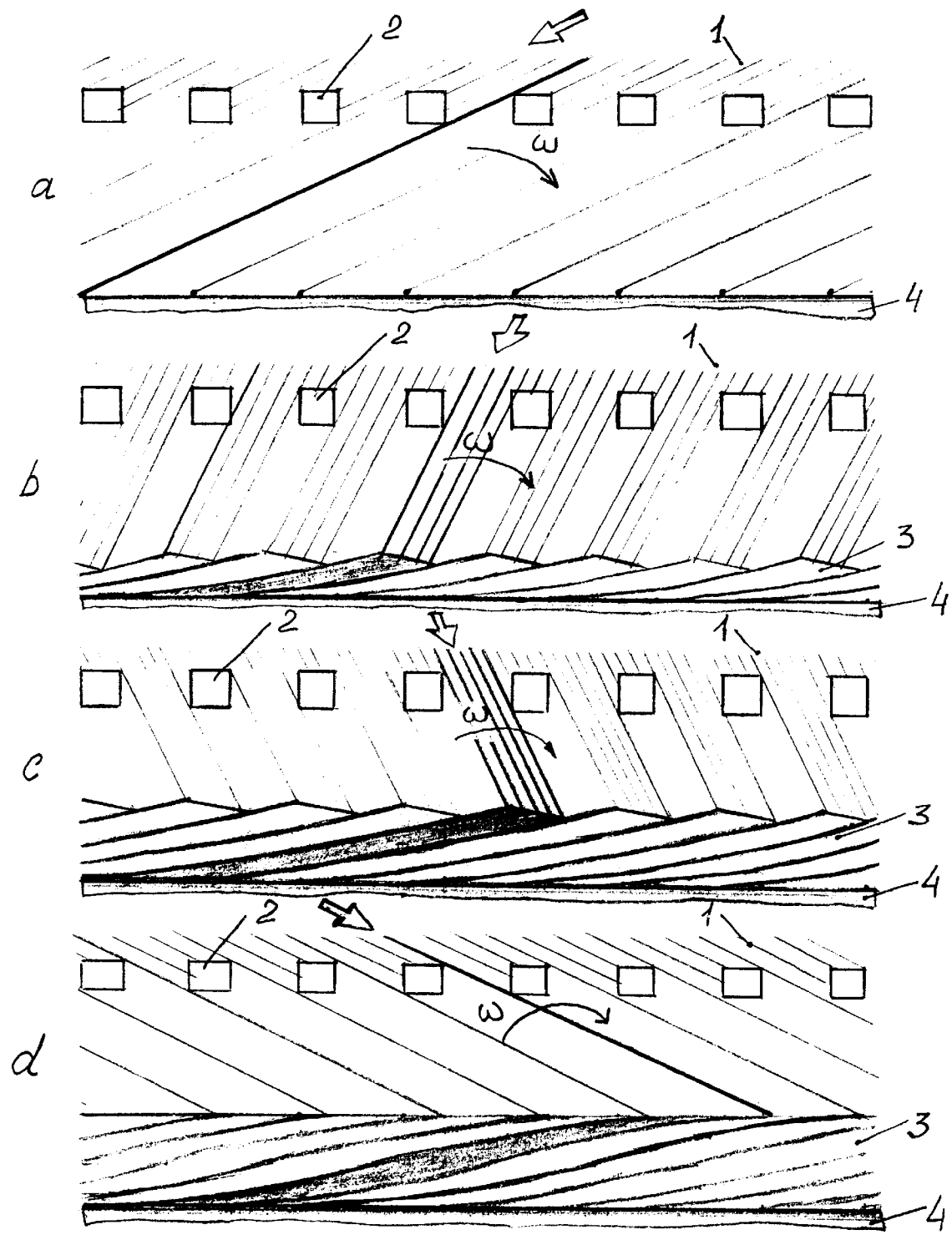
FIG. 3 is a cross sectional view of the coating, taken at different steps during a half-rotation of the substrate in a coating process in accordance with the present invention.

FIG. 3 shows how the partitions 6 of the screen 2 create the multiple separated-in-space deposition zones in the flow 1 on the surface of the substrate 4. As the substrate 4 rotates relative to the flow, the multiple separated-in-space deposition zones migrate over the surface of the substrate. The rotation may be continuous to provide constant migration of the separated-in-space deposition zones across the surface of the substrate. With this, every flow builds its own structural element.

Figure 4:
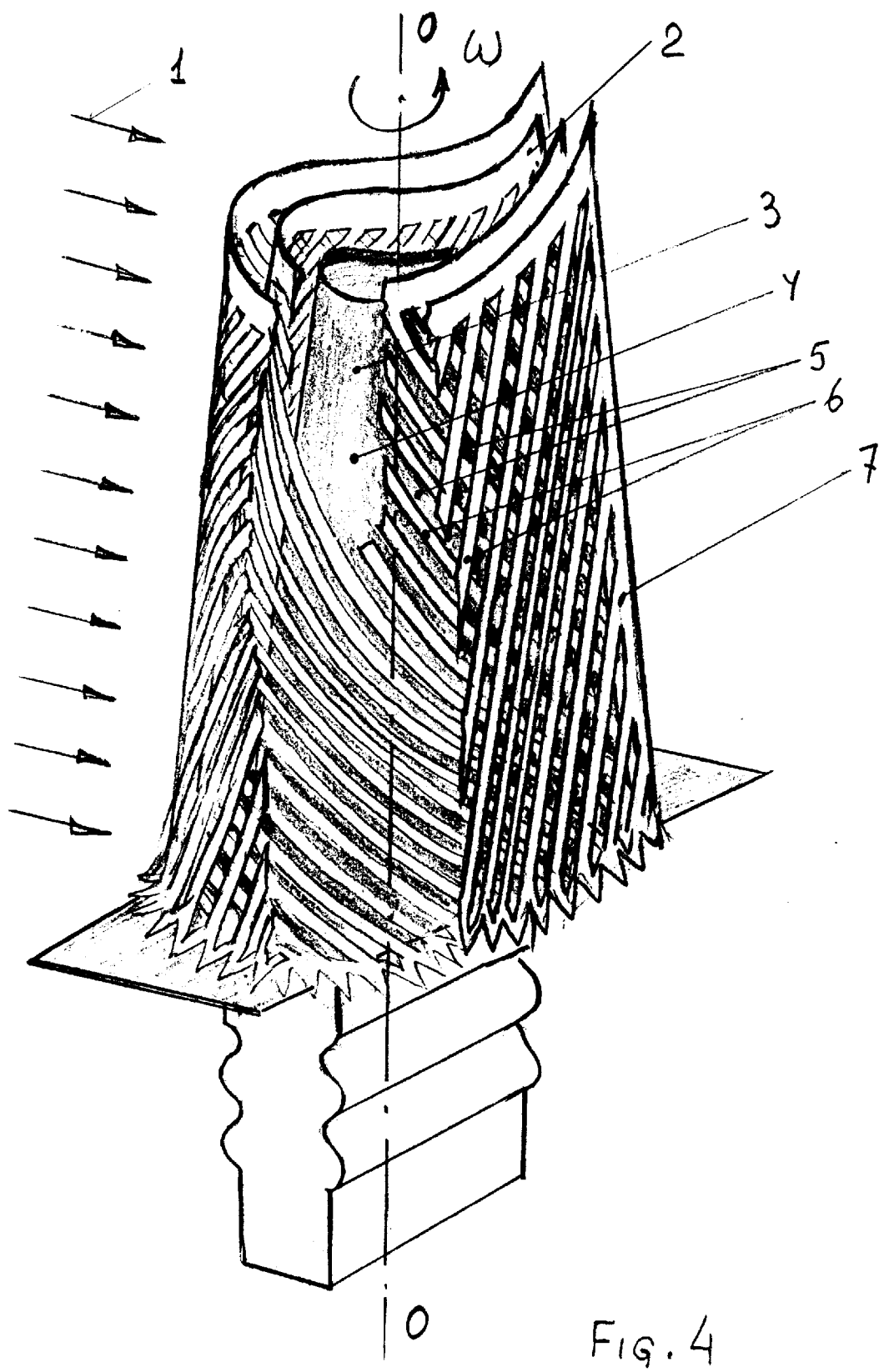
FIG. 4 shows the additional screen.

FIG. 4 To provide a more complex mode of migration of the deposition zones, an additional screen 7 is placed between the deposited material source and the first screen 2. The additional screen can be movable, immovable, flat, enclosing the first screen along its contour, etc. The additional screen is an additional plate with holes, curved along a closed contour enclosing the first screen. This clearance between the first screen and the additional screen 7 is the same across the entire screen, and is the same as the clearance between the surface of the substrate 4 and the first screen 2. The slots in the additional screen are the same as or similar to the slots 5 in the first screen 2. The additional screen may be fixed to the first screen and/or the substrate 4 so that is rotates with the substrate 4 and the first screen 2 about the rotation axis 0—0. Alternatively, the additional screen may be free of the first screen 2, so that it can rotate separately from the first screen 2.

The holes (slots) in the additional screen can be embodied so as to meet the tasks of the coating being designed; i.e., they can be analogous in form, orientation and distribution to those of the first screen.

The coating application is performed until the necessary thickness of the coating 3 is obtained on the surface of the substrate 4.

The suggested method for quasi-plasticity behavior coatings formation is a method of controlling the structure and properties of coatings. Changing conditions of material deposition onto a substrate surface to obtain constantly migrating separated-in-space deposition zones, it is possible to produce a coating of optimal properties for specific operational conditions in every particular case. Using the method of depositing a material in the form of separated-in-space zones, migrating over the substrate surface (i.e. replacement of an integral build-up front by a discrete migrating build-up front), permits the effect of quasi-plasticity by PVD and CVD in a technological vacuum. With this, the coating is formed of discrete stratified structural elements. The form, the orientation and the dimensions of these structural elements are determined by the form of the deposition zone, by the route and rate of the zone migration, and the density of the deposited material flow. Migrating over the substrate surface, the material deposition zone "draws" the shape and directs the orientation of a growing structural element of the coating. Its thickness depends on a quantity of the material being deposited in a unit of time. The width of an element is determined by the slot width in the screen.

After the application is completed, the screen is withdrawn and final treatment of the coating is performed (e.g., high-temperature re-crystallization vacuum annealing).

It is to be noted that the effect of quasi-plasticity behavior in the coatings is mainly comprised of the following two components:

Transferring to a coating an additional degree of growth freedom (i.e. due to the replacement of an integral build-up front by a discrete migrating build-up front);

Designing a coating by the purposeful formation of its structural elements, due to the predetermined migration of the deposition zones, forming these structural elements of the coating (thus, realizing the principles and effects being a feature of composite materials).

According to the preferred embodiment of the invention (though there can be quite a number of the embodiments), a high-temperature resistant NiCrAlY system coating was applied onto a protected component of Ni alloy by the method of PVD technology. A comparative test was conducted, using two sample kits of blades: the first one having been coated by traditional integral build-up front, the second one coated by the proposed discrete migrating build-up front. The latter kit exhibited significantly improved operational properties (the lifetime of the components increased more than 400 percent).

The described sequence of operations was performed for high-temperature resistant coating application to a substrate made of high-temperature resistant casting Ni alloy. A sample kit of protected components was taken and coated according to the method proposed. So as to compare it to the prototype, the coating of the same chemical combination was applied onto the second sample kit of the similar components, with all of the process conditions remaining the same, with the exception of the build-up front parameter. The first sample kit was coated by the discrete, migrating build-up front, i.e., the proposed method, and the second sample kit—by the integral build-up front—the prototype method.

Several more kinds of samples were also used. NiCrAlY system coatings were applied by the physical vapor deposition method onto substrates made of stainless steel and high-temperature resistant Ni alloy. The stainless steel substrates were used as bending test samples (dimensions: 1×10×50 mm). Fatigue test samples of 4×24×96 mm and the protected components were made of a high-temperature resistant Ni alloy by casting. An average coating thickness on the bending test samples were 40 microns, and on the Ni alloy—60 microns.

Prior to the coating application, the substrate surface was prepared in the following way: sand-blowing, annealing, washing in gasoline and acetone, sand-blowing, then a final ionic treatment. The coating application was performed in a device with central location of the cathode. At the distance of 350–400 mm from the cathode, the substrates were mounted in special mounting hardware spots, rotating relative to the cathode and around their axis during the coating deposition process. The modes of coating application were as follows: current—750 A, voltage—27 V, vacuum—0.0001 mm Hg. Duration of deposition: for the prototype method—3 h, for the proposed method—from 3.5 to 6 h (depending on the screening area). The screens were made of 0.15 mm stainless steel sheets. After coating application, the substrates were exposed to diffusion annealing under the temperature of 1010 C. during 4 h. in vacuum of 0.001 mm Hg. During the application process, the substrates rotated around their axis with angular velocity of $\omega=12$ rot/min. Valuation of the cracking resistance of the coating was done taking into consideration the depth and the quantity of the cracks in the coatings, after the sample was bent to a 90 degree angle with a curvature radius of 1.5 mm. The fatigue resistance of the coated substrates was valued on the basis of 20,000,000 cycles under normal temperature.

The various screens used in the process had slot widths of 0.1 mm, 0.3 mm, 2.5 mm, 5.0 mm, 7.0 mm; the deviation of the slots to the rotation axis were 0, 15 and 30 degrees; and the slot lengths exceeded the dimensions of the substrate coated area.

The test of the samples with prototype method coatings showed the following results:

cracks depth: equal to the coating thickness (at coating thickness—40 microns);

fatigue resistance limits 250 MPa

The test results of the coatings, applied by the proposed method, are described in the table below. The best results of the test are as follows:

cracks depth: 3 microns (at coating thickness—40 microns);

fatigue resistance limit: 300 MPa

The Samples with Proposed Coatings Test Results

| | Process Parameters | | Test Results | |
|---|---|---|---|---|
| # | Slot width (mm) | Partition width (mm) | crack depth after bending, microns | fatigue resistance limit, MPa |
| I | 0.1 | 0.1 | 4 | 270 |
| | 0.3 | 0.2 | 4 | 290 |
| | 0.6 | 0.4 | 3 | 300 |
| | 2.5 | 0.5 | 8 | 290 |
| | 5.0 | 0.5 | 12 | 270 |
| | 7.0 | 0.5 | 30 | 260 |
| # | slots deviation relative to substrate rotation axis (degrees) with slot width 0.6 mm and partition between slots 0.4 mm | | crack depth after bending, microns | fatigue resistance limit, MPa |
| II | 0 | | 3 | 300 |
| | 15 | | 3 | 290 |
| | 30 | | 4 | 270 |
| # | Distance between screen and surface (mm) with slot width 0.6 mm and partition between slots 0.4 mm | | crack depth after bending, microns | fatigue resistance limit MPa |
| III | 3.0 | | 7 | 260 |
| | 5.0 | | 3 | 290 |
| | 7.0 | | 3 | 300 |
| | 10.0 | | 3 | 300 |
| | 20.0 | | 5 | 280 |
| | 40.0 | | 9 | 270 |
| | 100.0 | | 23 | 250 |
| | 200.0 | | 35 | 250 |
| | 300.0 | | 40 | 250 |

In addition, examination of structure, phase composition and distribution of chemical elements within the coating thickness and over its surface was performed (both before the diffusion annealing and after). "Coating-substrate" interface composition, and the mutual diffusion of the chemical elements of the coating and the substrate was examined. Comparative analysis of NiCrAlY system coatings applied according to the proposed and the prototype methods showed the following specific features of the new coating:

a more homogeneous distribution of chemical elements within the coating thickness;

absence of intensive diffusion exchange between the coating, and the substrate materials during the annealing, which testifies to higher barrier properties of such coatings;

higher Al content in the coating;

the structure of the coating consists of discrete layers (structural elements), oriented along the substrate surface;

sufficiently higher resistance of the coating to crack formation under deformation stresses.

Though the present invention is described in terms of the mentioned specific embodiment, it is to be understood that the invention is not restricted by this description, but is expanded within the limits of hereinafter appearing claims.

I claim:

1. A process for a coating formation on a substrate surface, where said substrate is an airfoil of a gas turbine, by the method of deposition of material onto said substrate surface in vacuum, which process comprises the following principal steps: location of said substrate in a vacuum device chamber in front of a deposited material source; creation of the necessary vacuum in said chamber; deposition of said material up to a predetermined thickness of said coating; the improvement, comprising:

depositing said material in multiple separated-in-space deposition zones onto said substrate surface;

constantly migrating said separated-in-space deposition zones over said substrate surface within said coating formation process.

2. A process for a coating formation, as claimed in claim 1, wherein said step of depositing said material comprises dividing a flow of said deposited material into a multitude of separated-in-space flows.

3. A process for a coating formation, as claimed in claim 2, wherein:

said step of dividing said flow comprises placing in said flow between said substrate and said deposition material source a screen with holes; and said step of constantly migrating separated-in-space deposition zones comprises movement of said substrate relative to said separated-in-spaces flows.

4. A process for a coating formation, as claimed in claim 3, wherein said movement of said substrate relative to said separated-in-space flows comprises movement of said screen relative to said flow.

5. A process for a coating formation, as claimed in claim 4, wherein the screen comprises a plate with said holes being multiple slots, oriented and distributed over said surface along a rotation axis of said airfoil, while said rotation axis is oriented across said flow.

6. A process for a coating formation, as claimed in claim 5, wherein said plate is curved so as to enclose contours of the whole of said substrate surface, with a clearance between said plate and said substrate surface wide enough to provide said migration of said deposition zones due to said rotation of said airfoil around said rotation axis.

7. A process for a coating formation, as claimed in claim 6, wherein:

said plate is located along said contour equidistantly to said substrate surface; and said rotation of said substrate is done in conjunction with said plate.

8. A process for a coating formation, as claimed in claim 7, wherein at least one additional screen with holes is used, located between said deposited material source and said first screen.

9. A process for a coating formation, as claimed in claim 8, wherein:

said additional screen comprises an additional plate with holes;

said additional plate is curved along a closed contour enclosing said first screen, while between said additional screen and said first screen there in a clearance, providing free movement of said additional screen relative to said first screen; while said rotation of said airfoil is done, rotation of said additional screen relative to said rotation axis is done.

10. A process for a coating formation, as claimed in claim 9, wherein:

said holes of said additional screen are similar to said holes of said first screen;

said additional screen is located equidistantly to said first screen;

said rotation of said additional screen is done in conjunction with said first screen.

11. A process for forming a coating on a gas turbine airfoil, the process comprising the steps of:

placing said airfoil in a vacuum chamber;

creating a vacuum in said vacuum chamber;

directing a coating material toward said airfoil in multiple separated-in-space deposition zones onto the surface of said airfoil; and migrating said multiple separated-in-space deposition zones over the surface.

12. The process of claim 11, wherein said step of directing coating material toward said airfoil comprises performing a chemical vapor deposition process.

13. The process of claim 11, wherein said step of directing coating material toward said airfoil comprises performing a physical vapor deposition process.

14. The process of claim 11, wherein said step of directing coating material toward said airfoil comprises performing a sputtering process.

15. The process of claim 11, wherein said step of directing a coating material toward said airfoil in multiple separated-in-space deposition zones onto said surface comprises placing a screen between said airfoil and a source of the coating material.

16. The process of claim 15, wherein said step of placing a screen between said airfoil and said source of said coating material comprises spacing said screen apart from said surface.

17. The process of claim 16, wherein said step of migrating said multiple separated-in-space deposition zones over said surface comprises moving said airfoil relative to said source of said coating material.

18. The process of claim 17, wherein said step of moving said airfoil relative to said source of coating material comprises rotating said airfoil and said screen relative to a flow of coating material.

* * * * *